US008431928B2

(12) United States Patent
Tiwari et al.

(10) Patent No.: US 8,431,928 B2
(45) Date of Patent: *Apr. 30, 2013

(54) PIN STRUCTURES INCLUDING INTRINSIC GALLIUM ARSENIDE, DEVICES INCORPORATING THE SAME, AND RELATED METHODS

(75) Inventors: Ashutosh Tiwari, Sandy, UT (US); Makarand Karmarkar, Salt Lake City, UT (US); Nathan Wheeler Gray, American Fork, UT (US)

(73) Assignee: The University of Utah Research Foundation, Salt Lake City, UT (US)

(*) Notice: Subject to any disclaimer, the term of this patent is extended or adjusted under 35 U.S.C. 154(b) by 0 days.

This patent is subject to a terminal disclaimer.

(21) Appl. No.: 13/326,648

(22) Filed: Dec. 15, 2011

(65) Prior Publication Data
US 2012/0086007 A1    Apr. 12, 2012

Related U.S. Application Data

(63) Continuation of application No. 13/004,975, filed on Jan. 12, 2011, now Pat. No. 8,164, 092.

(60) Provisional application No. 61/455,286, filed on Oct. 18, 2010.

(51) Int. Cl.
*H01L 29/04* (2006.01)
*H01L 29/10* (2006.01)
*H01L 31/00* (2006.01)

(52) U.S. Cl.
USPC   257/55; 257/53; 257/E31.033; 257/E29.336; 438/96

(58) Field of Classification Search ............. 136/243; 257/E31.033, E31.093, E29.336, E31.061
See application file for complete search history.

(56) References Cited

U.S. PATENT DOCUMENTS

| | | | |
|---|---|---|---|
| 4,370,510 A * | 1/1983 | Stirn ........................ | 136/262 |
| 4,376,228 A * | 3/1983 | Fan et al. ................. | 136/255 |
| 4,664,940 A | 5/1987 | Bensoussan et al. | |
| 5,627,383 A * | 5/1997 | Cunningham et al. ......... | 257/17 |
| 5,714,404 A * | 2/1998 | Mitlitsky et al. ............... | 438/94 |
| 5,828,080 A * | 10/1998 | Yano et al. ................. | 257/43 |
| 7,083,998 B2 * | 8/2006 | Chu et al. .................... | 438/57 |
| 2007/0151592 A1* | 7/2007 | Forrest et al. ............... | 136/243 |
| 2007/0227587 A1 | 10/2007 | Walsh | |
| 2008/0142075 A1* | 6/2008 | Reddy et al. ................. | 136/257 |
| 2008/0176354 A1* | 7/2008 | Liu et al. ..................... | 438/48 |
| 2008/0265255 A1* | 10/2008 | Goyal ........................ | 257/64 |
| 2009/0047752 A1* | 2/2009 | Yamazaki et al. ............ | 438/96 |

(Continued)

OTHER PUBLICATIONS

International Search Report and Written Opinion received in PCT/US2011/056541, Feb. 29, 2012.

*Primary Examiner* — Jarrett Stark
(74) *Attorney, Agent, or Firm* — Bell & Manning, LLC

(57) ABSTRACT

Provided herein are PIN structures including a layer of amorphous n-type silicon, a layer of intrinsic GaAs disposed over the layer of amorphous n-type silicon, and a layer of amorphous p-type silicon disposed over the layer of intrinsic GaAs. The layer of intrinsic GaAs may be engineered by the disclosed methods to exhibit a variety of structural properties that enhance light absorption and charge carrier mobility, including oriented polycrystalline intrinsic GaAs, embedded particles of intrinsic GaAs, and textured surfaces. Also provided are devices incorporating the PIN structures, including photovoltaic devices.

18 Claims, 8 Drawing Sheets

U.S. PATENT DOCUMENTS

2009/0314337 A1    12/2009  Lee et al.
2010/0096003 A1*   4/2010   Hobbie .......................... 136/254
2010/0288345 A1*   11/2010  Huang .......................... 136/255
2010/0311229 A1*   12/2010  Einav ........................... 438/483
2011/0062416 A1*   3/2011   Wang et al. .................... 257/14
2011/0227017 A1*   9/2011   Yasutake ....................... 257/2

* cited by examiner

PIN STRUCTURES INCLUDING INTRINSIC GALLIUM ARSENIDE, DEVICES INCORPORATING THE SAME, AND RELATED METHODS

CROSS-REFERENCE TO RELATED APPLICATIONS

The present application is a continuation of U.S. patent application Ser. No. 13/004,975 that was filed Jan. 12, 2011, which claims priority to U.S. Provisional Patent Application No. 61/455,286 filed Oct. 18, 2010, the entire contents of which are hereby incorporated by reference.

BACKGROUND

First generation solar cells were made of bulk silicon. Second generation solar cells include thin film solar cells such as silicon-based single-junction and PIN junction solar cells. Amorphous silicon-based PIN junction solar cells have several advantages over bulk silicon solar cells and thin film silicon-based single-junction solar cells. However, such PIN junction solar cells suffer from light-induced degradation (LID) of the intrinsic amorphous silicon layer, which reduces the efficiency of the solar cells and limits their lifespan. In addition, these amorphous silicon-based PIN junction solar cells exhibit lower mobility of charge carriers than crystalline silicon-based solar cells. Finally, the absorption coefficient of amorphous silicon-based PIN junction solar cells is low.

The compound semiconductor, gallium arsenide (GaAs), finds use in a variety of semiconductor devices, including some photovoltaic devices, due to certain properties such as high mobility of charge carriers, drift velocity, direct bandgap of 1.45 eV, high absorption coefficient and efficiencies that are less sensitive to temperature. However, defects in GaAs crystals prevent these properties from being realized and tend to hamper its use. Thus, efforts have focused on forming GaAs of the highest crystalline quality (i.e., single crystalline GaAs) in order to achieve optimal properties. Such efforts can require intensive extraction, refining, and special growth conditions. Also challenging is the formation of high crystalline quality GaAs over substrates having a lattice mismatch and thermal mismatch with GaAs. As a result, use of GaAs in semiconductor devices has been limited to certain types of structures and is often prohibitively expensive.

SUMMARY

Provided herein are PIN structures, devices incorporating the PIN structures and methods for making the PIN structures.

In one aspect, PIN structures are provided. The PIN structures include a layer of amorphous n-type silicon, a layer of intrinsic GaAs disposed over the layer of amorphous n-type silicon, and a layer of amorphous p-type silicon disposed over the layer of intrinsic GaAs. The layer of intrinsic GaAs may be characterized by its crystal structure. The layer of intrinsic GaAs may include varying amounts of non-oriented polycrystalline intrinsic GaAs, oriented polycrystalline GaAs, amorphous intrinsic GaAs, or combinations thereof. The layer of intrinsic GaAs may include intrinsic GaAs particles or metallic particles embedded within and distributed throughout the layer. Exemplary sizes and densities of these particles are described below. A surface of the layer of intrinsic GaAs may include a random distribution of protrusions projecting away from the surface of the layer. Exemplary sizes, shapes, and densities of these protrusions are described below. The ratio of gallium to arsenic and the bandgap of the layer of intrinsic GaAs may vary as described below.

In another aspect, methods for forming the layers of intrinsic GaAs and the PIN structures incorporating the layers are provided. One method is based on the technique of pulsed laser deposition (PLD). Another method is based on the techniques of PLD and chemical vapor deposition (CVD). In both methods, the inventors have found that certain combinations and ranges of deposition parameters provide layers of intrinsic GaAs having various combinations of the structural properties, surface morphologies, and light absorbing properties described herein.

In yet another aspect, devices incorporating the PIN structures, including photovoltaic devices and solar cells are provided.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

DETAILED DESCRIPTION

Figure 1:
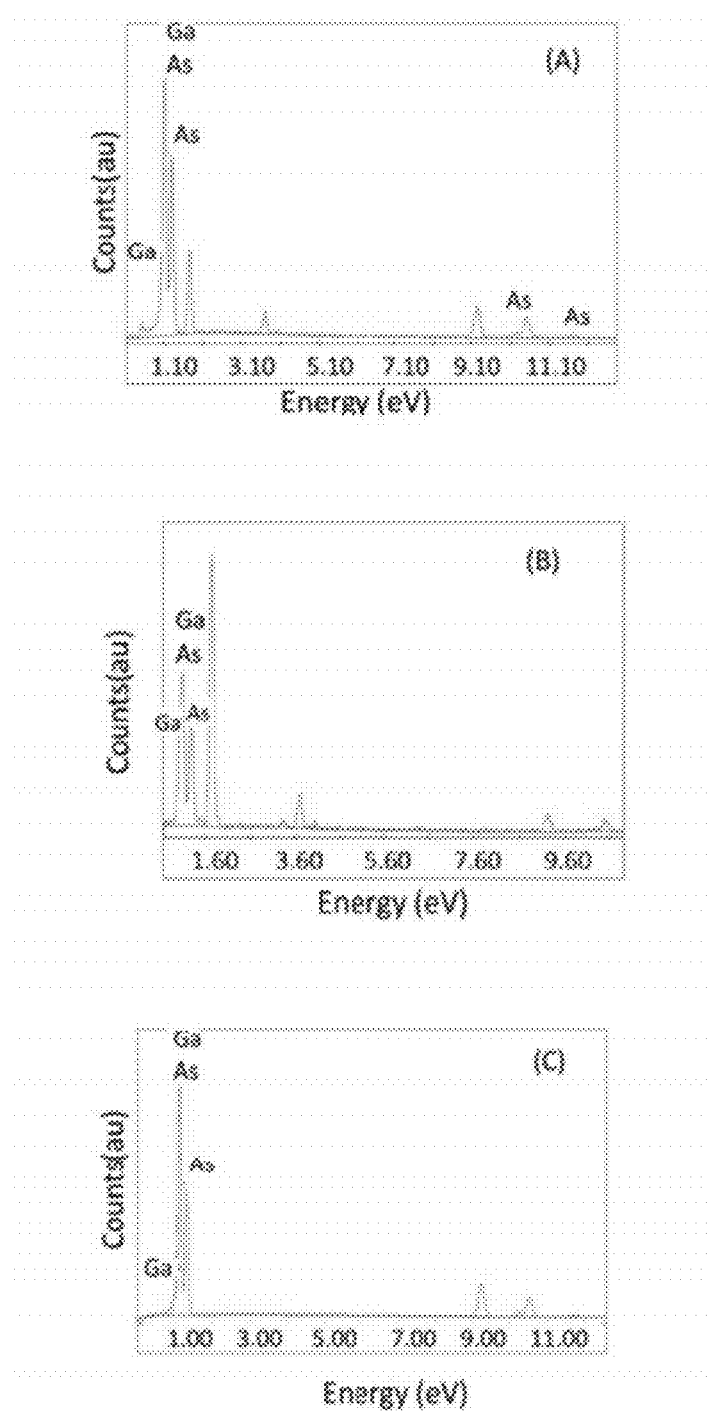
FIGS. 1A-C show the EDAX spectra of three intrinsic GaAs layers formed according to methods disclosed herein.

Provided herein are PIN structures, devices incorporating the PIN structures and methods for making the PIN structures.

Certain aspects of the invention are based, at least in part, on the inventors' development of methods for forming layers of gallium arsenide (GaAs) having certain structural properties that render them particularly suitable for use as the intrinsic semiconductor layer in PIN structures. The methods are based on the technique of pulsed laser deposition (PLD) and in some aspects, on PLD and chemical vapor deposition (CVD). Compared to conventional methods for forming layers of GaAs such as molecular beam epitaxy, organic molecular vapor phase epitaxy, chemical vapor deposition and low vacuum sputtering, the disclosed methods are cheaper (using less sophisticated equipment), less time intensive, and/or can reduce or prevent contamination from organic molecules. Most notably, the disclosed methods are capable of engineering layers of GaAs having certain structural properties, including oriented GaAs crystal grains (even on amorphous substrates), embedded GaAs particles, and/or textured surfaces in a single processing step. Although the layers of GaAs are not single crystalline or monocrystalline, their unique structural properties enable efficient light absorption and charge carrier collection. Moreover, the layers of GaAs do not suffer from LID. As a result, the disclosed layers of GaAs are particularly suitable for use as the intrinsic semiconductor layer in PIN structures and in photovoltaic devices incorporating such structures.

PIN Structures

The disclosed PIN structures include a layer of amorphous n-type silicon, a layer of intrinsic GaAs disposed over the layer of amorphous n-type silicon, and a layer of amorphous p-type silicon disposed over the layer of intrinsic GaAs. The term "amorphous" refers to a material having no long-range order and may be used to distinguish non-oriented polycrystalline, oriented polycrystalline and single crystalline materials which exhibit varying degrees of long-range order. In some embodiments, the layer of intrinsic GaAs is both in direct contact with the layer of amorphous n-type silicon below and with the layer of amorphous p-type silicon above. In some embodiments, the layers of the PIN structure are each continuous layers. The term "continuous" may be used to distinguish layers which may be formed of discrete regions of a first type of material laterally separated by regions of second type of material, thereby forming a discontinuous layer of the first type of material.

The layer of intrinsic GaAs may be characterized by its crystal structure. In some embodiments, the layer includes non-oriented polycrystalline intrinsic GaAs. The term "non-oriented polycrystalline" refers to a material composed of multiple crystal grains, the grains having different sizes and different, random orientations. The term may be used to distinguish amorphous, oriented polycrystalline and single crystalline materials. The amount of intrinsic GaAs in the form of non-oriented polycrystalline in the layer may vary. In some embodiments, the layer includes about 0.1% to 100% non-oriented polycrystalline intrinsic GaAs. This includes embodiments in which the layer includes about 0.5% or greater, 1% or greater, 10% or greater, 30% or greater, 50% or greater, 70% or greater, or 90% or greater non-oriented polycrystalline intrinsic GaAs.

In some embodiments, the layer of intrinsic GaAs includes oriented polycrystalline intrinsic GaAs. The term "oriented polycrystalline" refers to a polycrystalline material in which the crystal grains of the material are each aligned along a particular crystallographic plane. In some such embodiments, the oriented polycrystalline intrinsic GaAs includes crystal grains aligned along the (220) crystallographic plane. The amount of intrinsic GaAs in the form of oriented polycrystalline intrinsic GaAs in the layer may vary. In some embodiments, the layer includes about 0.1% to 100% oriented polycrystalline intrinsic GaAs. This includes embodiments in which the layer includes about 0.5% or greater, 1% or greater, 5% or greater, 10% or greater, 20% or greater, 30% or greater, 50% or greater, 70% or greater, or 90% or greater oriented polycrystalline intrinsic GaAs. As further discussed in the methods section and examples below, the inventors have found that certain combinations and certain ranges of deposition parameters facilitate the formation of oriented polycrystalline intrinsic GaAs. It is notable that the disclosed methods are capable of achieving oriented polycrystalline intrinsic GaAs over amorphous substrates since amorphous substrates do not have any underlying crystal structure with which the overlying layer of intrinsic GaAs can align. The presence of oriented polycrystalline intrinsic GaAs in the layers of intrinsic GaAs increases charge carrier mobility and collection efficiency.

In some embodiments, the layer of intrinsic GaAs includes amorphous intrinsic GaAs. The term "amorphous" has been defined above. The amount of intrinsic GaAs in the form of amorphous intrinsic GaAs in the layer may vary. In some embodiments, the layer includes about 0.1% to 100% amorphous intrinsic GaAs. This includes embodiments in which the layer includes about 0.5% or greater, 1% or greater, 10% or greater, 30% or greater, 50% or greater, 70% or greater, or 90% or greater amorphous intrinsic GaAs. In other embodiments, the layer includes about 90% or less, 70% or less, 50% or less, 30% or less, 10% or less, 5% or less, or 1% or less amorphous intrinsic GaAs.

In still other embodiments, the layer of intrinsic GaAs is not a layer of single crystalline intrinsic GaAs. The terms "single crystal," "single crystalline," and "monocrystalline" may be used interchangeably according to their customary meanings.

The layer of intrinsic GaAs may include regions of intrinsic GaAs having different crystal structures. In some embodiments, the layer includes regions of non-oriented polycrystalline intrinsic GaAs and regions of amorphous intrinsic GaAs. In other embodiments, the layer includes regions of non-oriented polycrystalline intrinsic GaAs and regions of oriented polycrystalline intrinsic GaAs. In still other embodiments, the layer includes regions of non-oriented polycrystalline intrinsic GaAs, regions of oriented polycrystalline GaAs and regions of amorphous intrinsic GaAs. The relative amounts of non-oriented polycrystalline intrinsic GaAs, oriented polycrystalline intrinsic GaAs and amorphous intrinsic GaAs may vary within the ranges provided above.

Known analytical crystallographic techniques (e.g., x-ray diffraction) may be used to characterize the crystal structure of the layer of intrinsic GaAs and to determine the relative amounts of non-oriented polycrystalline intrinsic GaAs, oriented polycrystalline intrinsic GaAs and amorphous intrinsic GaAs within the layer.

The layer of intrinsic GaAs may include intrinsic GaAs particles embedded within and distributed throughout the layer. The size and shape of the intrinsic GaAs particles may vary. In general, the average size of the particles is greater than the average size of crystal grains within a layer of non-oriented polycrystalline intrinsic GaAs or oriented polycrystalline intrinsic GaAs. Thus, the particles may be readily distinguished from the surrounding matrix of crystal grains. The particles may be characterized by a maximum dimension. In some embodiments, the particles exhibit an average maximum dimension of about 100 nm or greater. This includes embodiments in which the average maximum dimension is about 200 nm or greater, 500 nm or greater, 1 µm or greater, 5 µm or greater, or 10 µm or greater. In other embodiments, the particles may exhibit an average maximum dimension ranging from about 100 nm to 10 µm. This includes embodiments in which the average maximum dimension ranges from about 150 nm to 10 µm, 500 nm to 10 µm, 1 µm to 10 µm, 100 nm to 5 µm, 100 nm to 1 µm, or 100 nm to 500 nm. Similarly, the areal density of the particles may vary. In some embodiments, the density is about $5\times10^4$ cm$^{-2}$ or greater. This includes embodiments in which the density is about $5\times10^5$ cm$^{-2}$ or greater, $5\times10^6$ cm$^{-2}$ or greater, $5\times10^7$ cm$^{-2}$ or greater, or $1\times10^8$ cm$^{-2}$ or greater. In other embodiments, the density ranges from about $5\times10^4$ cm$^{-2}$ to $1\times10^8$ cm$^{-2}$. This includes embodiments in which the density ranges from about $5\times10^5$ cm$^{-2}$ to $1\times10^8$ cm$^{-2}$, $5\times10^6$ cm$^{-2}$ to $1\times10^8$ cm$^{-2}$, $5\times10^7$ cm$^{-2}$ to $1\times10^8$ cm$^{-2}$, $5\times10^4$ cm$^{-2}$ to $1\times10^7$ cm$^{-2}$, $5\times10^4$ cm$^{-2}$ to $1\times10^6$ cm$^{-2}$, or $5\times10^4$ cm$^{-2}$ to $1\times10^5$ cm$^{-2}$.

As further discussed in the methods section and examples below, the inventors have found that decreasing the temperature of the target and/or the substrate facilitates the formation of intrinsic GaAs particles. The presence of intrinsic GaAs particles increases the light absorption of the layer of intrinsic GaAs via surface plasmon resonance (SPR). Unlike the surrounding matrix of amorphous, non-oriented polycrystalline, or oriented polycrystalline intrinsic GaAs, the intrinsic GaAs particles embedded within the layer are not elastically strained. As a result, the intrinsic GaAs particles exhibit different surface scattering, dielectric constant and refractive index, which contributes to SPR.

Similarly, the layer of intrinsic GaAs may include metallic particles embedded within and distributed throughout the layer. A variety of metals may be used, including noble metals. Suitable exemplary noble metals include ruthenium, rhodium, palladium, silver, osmium, iridium, platinum, gold, or combinations thereof. The size, shape, and density of the metallic particles may vary as described above with respect to intrinsic GaAs particles. Like intrinsic GaAs particles, the presence of metallic particles increases the light absorption of the layer of intrinsic GaAs via SPR.

Figure 2:
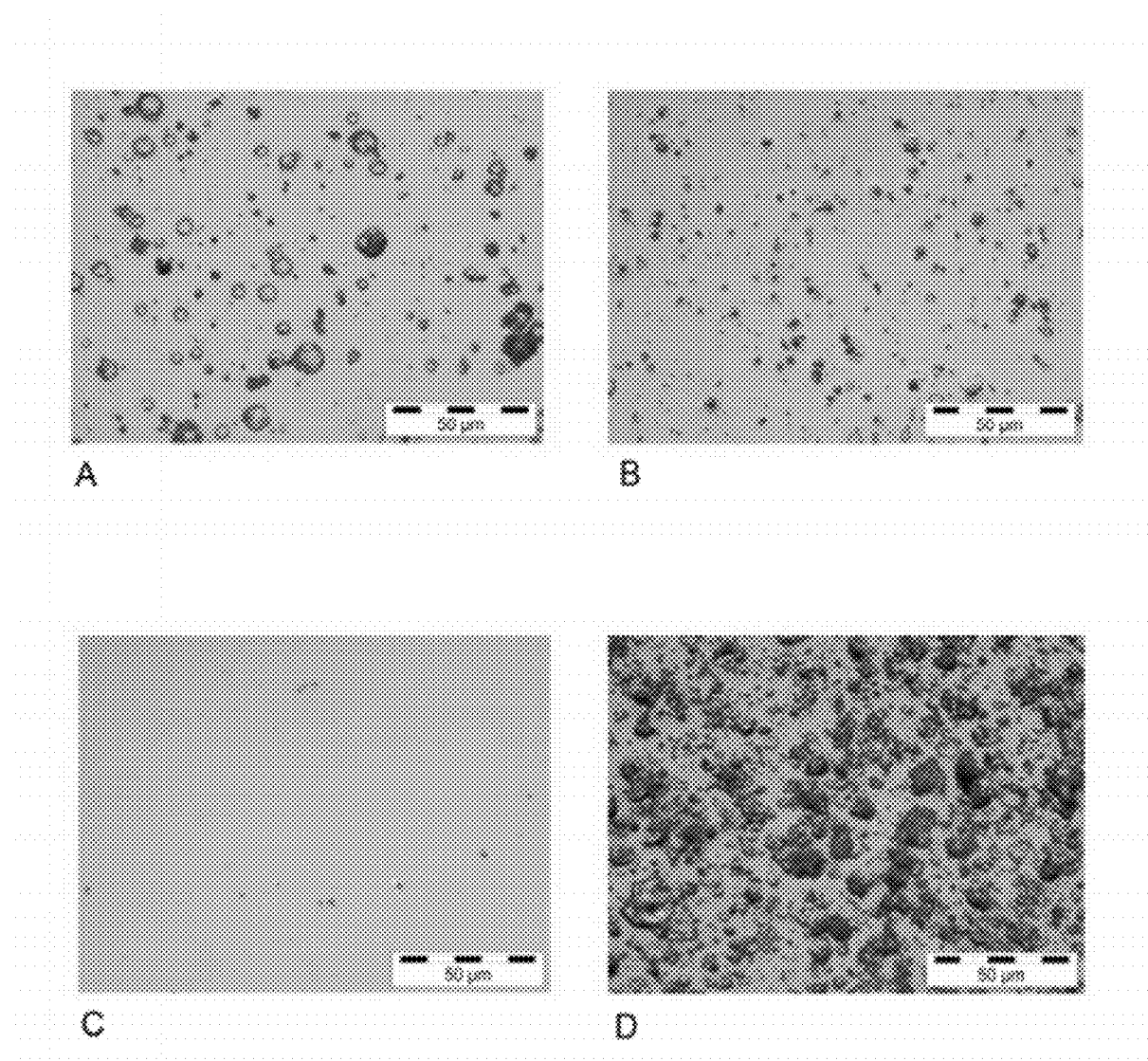
FIGS. 2A-D show optical micrographs of four intrinsic GaAs layers formed according to methods disclosed herein.

The layer of intrinsic GaAs may be characterized by its surface morphology. In some embodiments, a surface of the layer of intrinsic GaAs includes a random distribution of protrusions projecting away from the surface of the layer. The top surface, bottom surface, or both surfaces of the layer of intrinsic GaAs may include the protrusions. In some embodiments, the protrusions may be characterized by a circular cross-section (taken along a plane parallel to the surface of the layer of intrinsic GaAs). The term "circular" encompasses irregularly shaped cross-sections that are not perfectly circular. Exemplary surfaces having a random distribution of such protrusions are shown in FIG. 2. As shown in the figure, the protrusions are characterized by circular cross-sections. The protrusions project away from the surface of the layer to provide three-dimensionality to the protrusions, although the precise three-dimensional shape of the protrusions may vary. Possible shapes include rings, hemispheres, flattened hemispheres, partially collapsed hemispheres and the like.

The size of the protrusions may vary. The protrusions may be characterized by a diameter and a height. In some embodiments, the average diameter is about 50 nm or greater. This includes embodiments in which the average diameter is about 100 nm or greater, 500 nm or greater, 1 µm or greater, or 5 µm or greater. In other embodiments, the average diameter ranges from about 50 nm to 5 µm. This includes embodiments in which the average diameter ranges from about 50 nm to 5 µm, 100 nm to 5 µm, 500 nm to 5 µm, 1 µm to 5 µm, 50 nm to 1 µm, 50 nm to 500 nm, 50 nm to 250 nm, or 50 nm to 100 nm. In some embodiments the average height is about 10 nm or greater. This includes embodiments in which the average height is about 50 nm or greater, 100 nm or greater, 250 nm or greater, or 500 nm or greater. In other embodiments, the average height ranges from 10 nm to 500 nm. This includes embodiments in which the average height is about 10 nm to 250 nm, 10 nm to 100 nm, 10 nm to 50 nm, 50 nm to 500 nm, 100 nm to 500 nm, or 250 nm to 500 nm.

Similarly, the number density of the protrusions (number of protrusions per unit area) may vary. In some embodiments, number densities may be about $1 \times 10^8$ cm$^{-2}$ or less. This includes embodiments in which the number density is about $1 \times 10^7$ cm$^{-2}$ or less, $1 \times 10^6$ cm$^{-2}$ or less, $1 \times 10^5$ cm$^{-2}$ or less, or $1 \times 10^4$ cm$^{-2}$ or less. In some embodiments the number density of the protrusions is sufficiently small (e.g., less than $1 \times 10^4$ cm$^{-2}$) that the surface of the layer of intrinsic GaAs is substantially smooth. Such an embodiment is shown in FIG. 2C.

As further discussed in the methods section and examples below, the inventors have found that the cooling rate of the substrate facilitates the formation of the protrusions. The presence of protrusions on one or both surfaces of the layer of intrinsic GaAs imparts varying degrees of roughness to the layer and increases light absorption of the layer by reducing the reflection of incoming light. The term "textured" may be used to describe a layer of intrinsic GaAs having at least one surface that includes a random distribution of protrusions projecting away from the surface. It is notable that the disclosed methods are capable of providing textured surfaces simultaneously during the formation of the layer of intrinsic GaAs itself. In other words, no additional processing steps such as chemical etching or mechanical etching steps are necessary.

The layer of intrinsic GaAs may be characterized by the ratio of gallium to arsenic. In some embodiments, the ratio of Ga:As is about 1:1. Unlike some conventional methods, certain of the disclosed methods are capable of achieving a stoichiometric (e.g., 1:1) ratio of Ga:As. However, certain of the disclosed methods are also capable of achieving other ratios of Ga:As. Thus, in some embodiments, the ratio of Ga:As ranges from about 1.3:1 to 1:1.3. This includes embodiments in which the ratio ranges from about 1.1:1, 1.2:1, 1:1.2, or 1:1.1. As compared to some conventional methods, certain of the disclosed methods are also capable of providing layers of intrinsic GaAs of high purity, i.e., with substantially no contamination from organic molecules.

The layer of intrinsic GaAs may be characterized by its bandgap. The disclosed methods are capable of achieving layers of intrinsic GaAs having different bandgaps by adjusting the ratio of Ga:As and/or the fraction of amorphous content within the layer. In some embodiments, the layer of intrinsic GaAs is characterized by a bandgap of about 1.45 eV or higher. This includes embodiments in which the bandgap is about 1.5 eV or higher, 1.6 eV or higher, 1.8 eV or higher, 2.0 eV or higher, or 2.2 eV or higher. This also includes embodiments in which the bandgap ranges from about 1.45 eV to about 2.4 eV.

The layer of intrinsic GaAs may be characterized by its thickness. In some embodiments, the layer of intrinsic GaAs is characterized by a thickness of about 10 µm or less. This includes embodiments in which the thickness is about 5 µm or less, 1 µm or less, 500 nm or less, or 100 nm or less. In other embodiments, the thickness ranges from about 100 nm to 10 µm. This includes embodiments in which the thickness ranges from about 100 nm to 5 µm, 100 nm to 1 µm, 100 nm to 500 nm, 500 nm to 10 µm, 1 µm to 10 µm, or 5 µm to 10 µm. Similarly, the thickness of the layer of amorphous p-type silicon and the layer of amorphous n-type silicon may vary. The thicknesses of these layers may range from about 10 nm to 100 nm.

Devices

Any of the disclosed PIN structures may be incorporated into a variety of semiconductor devices. The PIN structures are well suited for use in photovoltaic devices, including solar cells.

In one embodiment, a photovoltaic device includes any of the disclosed PIN structures, a first electrode in electrical contact with the layer of amorphous n-type silicon, a second electrode in electrical contact with the layer of amorphous p-type silicon and a voltage source in electrical contact with the first and second electrodes.

Figure 7:
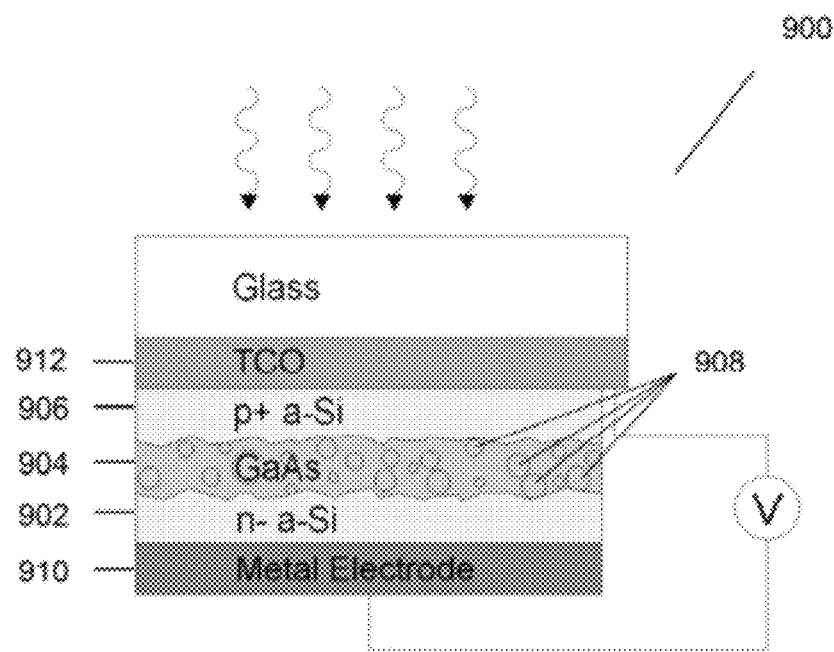
FIG. 7 shows a schematic of a photovoltaic device.

A schematic of an illustrative photovoltaic device 900 is shown in FIG. 7. The photovoltaic device includes a PIN structure including a layer of amorphous n-type silicon 902, a layer of intrinsic GaAs 904 disposed over and in direct contact with the layer of amorphous n-type silicon and a layer of amorphous p-type silicon 906 disposed over and in direct contact with the layer of intrinsic GaAs. The layer of intrinsic GaAs 904 includes textured top and bottom surfaces and intrinsic GaAs particles 908 embedded within and distributed throughout the layer. The device also includes a first electrode 910, a second electrode 912 and a voltage source.

Methods

Also provided are methods of forming any of the layers of intrinsic GaAs disclosed above, as well as PIN structures including the layers.

In one aspect, a method based on the technique of pulsed laser deposition (PLD) is provided. The method includes exposing a target material including a source of intrinsic GaAs to a pulsed laser and forming a layer of intrinsic GaAs on a substrate via pulsed laser deposition. A variety of sources of intrinsic GaAs and substrates may be used. Exemplary sources and substrates are provided in the examples, below. In some embodiments, the substrate is a layer of amorphous n-type silicon or a layer of amorphous p-type silicon. The methods may be carried out in standard chambers for PLD using laser sources typically employed for PLD.

Several deposition parameters may be varied, including the temperature of the target material, the laser energy, the laser frequency, the total number of laser shots, and the substrate cooling rate. Suitable ranges for these parameters are provided in Table 1.

TABLE 1

Suitable ranges for deposition parameters

| Deposition Parameter | Suitable Range |
| --- | --- |
| Target material temperature | −196° C. (via contact with liquid nitrogen) to room temperature |
| Substrate temperature | −196° C. (via contact with liquid nitrogen) |
| Laser energy | 30 mJ to 80 mJ |
| Laser frequency | 5 Hz to 10 Hz |
| Total number of laser shots (1000s) | 8 to 54 |
| Substrate cooling rate | 1 to 10° C./min |

As noted above, the inventors have found that certain deposition parameters may be optimized to achieve layers of intrinsic GaAs having particular structural properties. As shown in the Examples below, the inventors have found that decreasing the temperature of the target and/or the substrate facilitates the formation of intrinsic GaAs particles. In addition, decreasing the temperature of the target facilitates the formation of stoichiometric (e.g., 1:1) ratios of Ga:As. Notably, conventional PLD techniques keep the target at room temperature and heat the substrate. In these conventional PLD techniques, the temperature of the target further increases during laser ablation. Thus, in addition to ablation, some evaporation/sublimation of the target also occurs. These latter processes are equilibrium processes. Thus, different components of the target will evaporate/sublimate at different rates, resulting in non-stoichiometric layers.

In addition, the inventors have found that a certain combinations and certain ranges of deposition parameters facilitate the formation of oriented polycrystalline intrinsic GaAs, even over amorphous substrates. For example, the inventors have found that target temperature in the range of −196° C. to room temperature, substrate temperature at −196° C., substrate cooling rate in the range 5-10° C./min, laser energy in the range 30-50 mJ, laser frequency in the range 5-10 Hz, and background pressure in the range $1.0 \times 10^{-6}$ - $5.0 \times 10^{-6}$ mbar results in the formation of oriented polycrystalline intrinsic GaAs. It is believed that within these ranges, ablated atoms from the target are highly energetic such that when they reach the substrate, they possess sufficient mobility to rearrange themselves on the substrate to form oriented polycrystalline intrinsic GaAs.

The inventors have also found that the cooling rate of the substrate (from room temperature to a deposition temperature of −196° C.) facilitates the formation of the protrusions described above. The cooling induces thermal stress and strain in the substrate, leading to morphological changes in the substrate which affect the subsequent growth of other layers over the substrate, including layers of intrinsic GaAs.

The examples below provide specific, exemplary sets of deposition parameters for achieving layers of intrinsic GaAs having various combinations of the structural properties disclosed herein.

In another aspect, a hybrid method based on the techniques of pulsed laser deposition (PLD) and chemical vapor deposition (CVD) is provided. The method may be referred to as pulsed laser assisted-chemical vapor deposition (PLA-CVD). Depending upon the composition of the target material and the substrate, the method may be used to provide semiconductor layers including any of the Group III-V elements or alloys thereof on a variety of substrates. The method includes exposing a target material to a pulsed laser, wherein the target material includes a frozen solution of an organic precursor of a Group III element, an organic precursor of a Group IV element, an organic precursor of a Group V element, or combinations thereof; and forming a semiconductor layer on a substrate via pulsed laser deposition, wherein the semiconductor layer includes the Group III element, the Group IV element, the Group V element, or alloys thereof.

Organic precursors of Group III elements, Group IV elements and Group V elements are known. In some embodiments, the target material includes a frozen solution of an organic precursor of gallium (Ga) and an organic precursor of arsenic (As). Again, such organic precursors are known, although trimethyl gallium and arsenic amide are suitable exemplary organic precursors. In such embodiments, the method provides a layer of intrinsic GaAs. A variety of substrates may be used. In some embodiments, the substrate is a layer of amorphous n-type silicon or a layer of amorphous p-type silicon.

Figure 8:
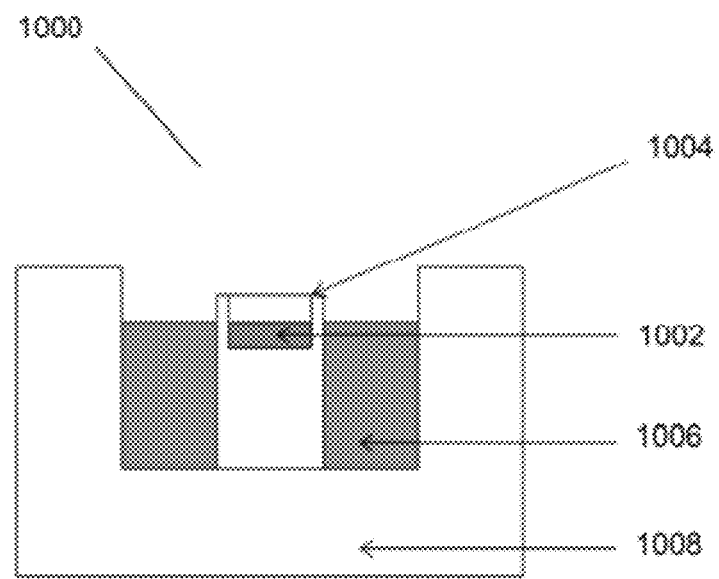
FIG. 8 shows a schematic of an apparatus for maintaining the frozen state of a target material for use with pulsed laser assisted chemical vapor deposition (PLA-CVD) as disclosed herein.

The target material may be formed by first forming a liquid solution of the organic precursor of the Group III element, the organic precursor of the Group IV element, the organic precursor of the Group V element, or combinations thereof in a solvent. A variety of solvents may be used, provided they are capable of dissolving the organic precursor(s). Toluene is a suitable exemplary solvent. The relative amounts of the organic precursors can be varied in the liquid solution depending upon the desired amount of the Group III element, the Group IV element and/or the Group V element in the semiconductor layer. Next, the liquid solution is frozen. The term "frozen" refers to a solution that was a liquid at room temperature but has been converted to a solid by lowering its temperature. A variety of methods may be used to freeze the target material. One such method involves the apparatus 1000 shown in FIG. 8. The solution that will provide the target material 1002 is held in a target holder 1004 which is immersed in a liquid nitrogen bath 1006 surrounded by a thermal insulating material 1008.

The PLA-CVD methods may be carried out on standard chambers for PLD using laser sources typically employed for PLD. However, the chambers are adapted to maintain the target material in a frozen state during PLD, e.g., the chamber may be adapted to accommodate the apparatus 1000 shown in FIG. 8. The deposition parameters may be varied within the ranges described above (although the target temperature will be that which maintains the target material in a frozen state) in order to provide layers of intrinsic GaAs having various combinations of the structural properties described above.

During laser ablation of the target material, the solvent, rather than the organic precursor(s), absorbs the laser energy to evaporate and form a plasma. The plasma transports the organic precursor(s) toward the substrate where they deposit and react to form the semiconductor layer.

Any of the disclosed methods may be modified to alter the composition of the deposited semiconductor layers. For example, dopants (or organic precursors of dopants) can be added to target materials in order to provide doped semiconductor layers. As another example, the methods can include exposing an additional target material to the pulsed laser, wherein the additional target material includes a noble metal. Any of the noble metals disclosed above may be used. Such a method provides semiconductor layers having metallic particles embedded within and distributed throughout the layer.

Any of the disclosed methods may further include other steps for forming other material layers (e.g., amorphous n-type or p-type silicon) over the deposited semiconductor layers in order to form any of the PIN structures disclosed herein. PLD or PLA-CVD may be used to form these other material layers or other known methods may be used.

The PIN structures and related methods will be understood more readily by reference to the following examples, which are provided by way of illustration and are not intended to be limiting.

EXAMPLES

Example 1

Formation of Layers of Intrinsic GaAs (i-GaAs) Using Pulsed Laser Deposition (PLD)

Layers of intrinsic GaAs were formed on various substrates using PLD. Substrates were cleaned ultrasonically in acetone solution to remove organic and inorganic debris. Substrates were further cleaned in methanol and isopropanol solutions. Alternatively, substrates may be cleaned using ozone or hydrofluoric acid. Cleaned substrates were loaded in a PLD chamber. The laser source was a KrF pulsed excimer laser with a wavelength of 248 nm and a pulse width of 25 ns.

High quality, single-crystal wafers of i-GaAs (GaAs wafer) or high purity, bulk polycrystalline i-GaAs (bulk GaAs) were used as the target material. Targets were cleaned and hydrogen fluoride etched prior to loading in the PLD chamber. The chamber was evacuated to about $1.0 \times 10^{-6}$ mbar. Once vacuum was reached, the laser was centered on the target for ablation. Targets were rastered and rotated to expose new target material for each laser shot. Several deposition parameters, including target temperature, laser energy, total number of laser shots, laser shot frequency, and cooling rate were varied in order to achieve layers of intrinsic GaAs having different structural properties. Table 2 lists eight different sets of deposition parameters used to prepare layers of intrinsic GaAs on various substrates (Si(111), p-type Si(100), glass, Corning glass, sapphire (0001), or GaAs). During deposition, the temperature of the substrate was maintained at $-196°$ C. (temperature of liquid nitrogen).

TABLE 2

Deposition Parameters

| Deposition Parameters | Target | Target temp. (° C.) | Substrate material | Laser Energy (mJ) | # shots (in 1000s) | Shot freq. (Hz) | Cooling rate (° C./min) |
|---|---|---|---|---|---|---|---|
| Set 1 | Bulk GaAs | RT | Si (111), P—Si(100), Glass | 80 | 12 | 10 | 5 |
| Set 2 | Bulk GaAs | RT | Si(111), P—Si(100), Glass | 50-30 | 24 | 10 | 5 |
| Set 3 | GaAs wafer | RT | GaAs, Glass, Sapphire (0001) | 50 | 8 | 10 | 10 |
| Set 4 | GaAs wafer | RT | Corning glass | 50 | 36 | 10 | 10 |
| Set 5 | GaAs wafer | RT | Corning glass | 50 | 36 | 5 | 10 |
| Set 6 | GaAs wafer | LN2 | Corning glass | 50-30 | 54 | 10 | 10 |
| Set 7 | GaAs wafer | LN2 | Corning glass | 50 | 54 | 10 | 10 |
| Set 8 | GaAs wafer | LN2 | Corning glass | 50 | 54 | 10 | 5 |

RT = room temperature
LN2 = temperature of liquid nitrogen

Table 3 provides a description of the type of layer of intrinsic GaAs (e.g., crystal structure, surface morphology, existence of iGaAs particles) achieved for each set of deposition parameters.

TABLE 3

Type of iGaAs layer achieved for the deposition parameters of Table 2

| Deposition Parameters | Type of iGaAs layer |
|---|---|
| Set 1 | Non-oriented polycrystalline iGaAs; no iGaAs particles; no surface texture; no oriented polycrystalline iGaAs |
| Set 2 | Oriented polycrystalline iGaAs; no iGaAs particles; no surface texture |

TABLE 3-continued

Type of iGaAs layer achieved for the deposition parameters of Table 2

| Deposition Parameters | Type of iGaAs layer |
|---|---|
| Set 3 | Oriented polycrystalline iGaAs; no iGaAs particles; surface texture |
| Set 4 | Oriented polycrystalline iGaAs; iGaAs particles; surface texture |
| Set 5 | Non-oriented polycrystalline iGaAs; iGaAs particles; surface texture |
| Set 6 | Non-oriented polycrystalline iGaAs; iGaAs particles; surface texture |
| Set 7 | Non-oriented polycrystalline iGaAs; iGaAs particles; surface texture |
| Set 8 | Non-oriented polycrystalline iGaAs; iGaAs particles; surface texture |

The iGaAs layers were analyzed using scanning electron microscopy (SEM) and energy dispersive x-ray analysis (EDAX). The EDAX spectrum of three layers formed under the deposition parameters of Set 1 (A), Set 2 (B) and Set 3 (C) are shown in FIG. 1 (y axis is counts and the x axis is energy). The spectra confirm the presence of both Ga and As and the absence of organic contaminants in the iGaAs layers.

Optical micrographs of the iGaAs layers were taken. Optical micrographs of four layers formed under the deposition parameters of Set 1 (A), Set 2(B), Set 3 (C) and Set 8 (D) are shown in FIG. 2. Each of the layers includes a random distribution of protrusions projecting away from the surface of the layer. However, the number density of the protrusions varies, showing that the deposition parameters can be adjusted to control surface morphology. The deposition parameters can be adjusted to provide layers having a small number of protrusions such that the surface is substantially smooth (C) as well as layers having a greater number of protrusions such that the surface is textured (A, B, D).

The iGaAs layers were studied using x-ray diffraction. X-ray diffraction scans of a iGaAs layer formed under the deposition parameters of Set 3 were obtained. A normal x-ray diffraction scan was obtained showing no preferential orientation of crystal grains within the layer. However, the low angle scans obtained at grazing angle ω=2° and grazing angle ω=10° showed that the intensity of the (220) crystallographic plane was equal to or higher than the intensity of the (111) crystallographic plane. These studies show that under certain deposition parameters, initially the crystal grains of iGaAs layers grow with no preferred orientation. However, as the thickness of the layers increase and the strain on the layers decrease, the crystal grains tend to align along the (220) crystallographic plane, thereby forming layers including oriented polycrystalline iGaAs, even on amorphous substrates.

Figure 3:
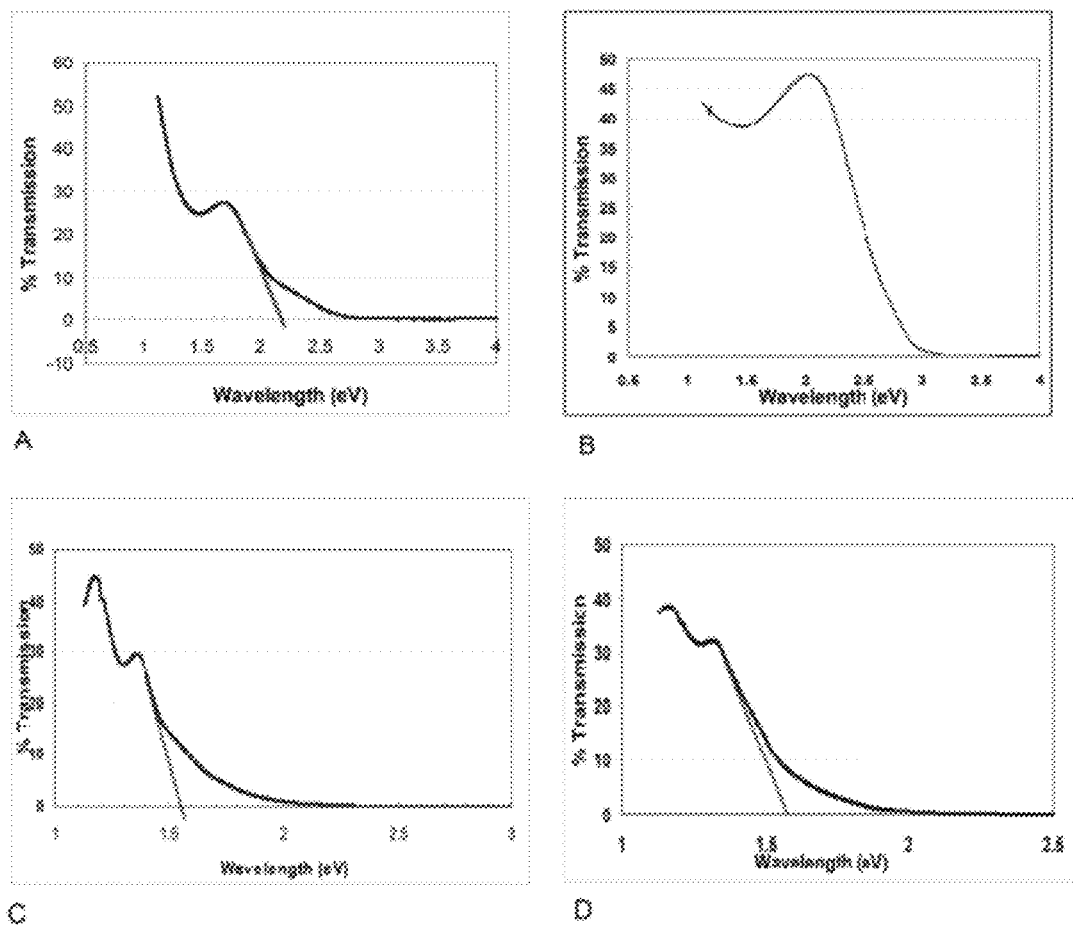
FIGS. 3A-D show transmission spectra of four intrinsic GaAs layers formed according to methods disclosed herein.
Figure 4:
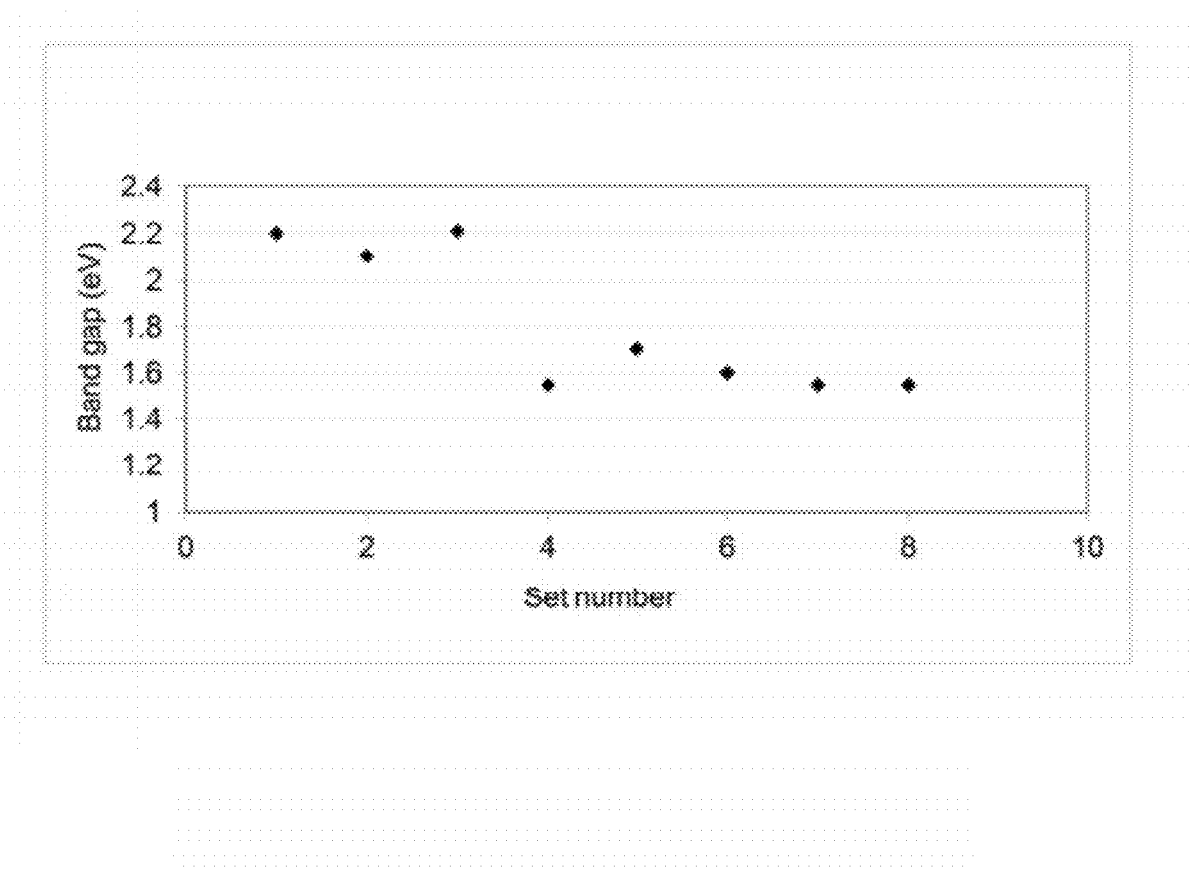
FIG. 4 shows a plot of the bandgap of eight intrinsic GaAs layers formed under eight different sets of deposition parameters.

The iGaAs layers were studied using UV-Visible transmission spectroscopy. Transmission spectra of four iGaAs layers formed under the deposition parameters of Set 2 (A), Set 3 (B), Set 5 (C) and Set 7 (D) are shown in FIG. 3. These studies show that the deposition parameters can be adjusted to provide control over the bandgap of the iGaAs layers. FIG. 4 plots the bandgap of eight iGaAs layers formed under different deposition parameters (Sets 1-8).

Figure 5:
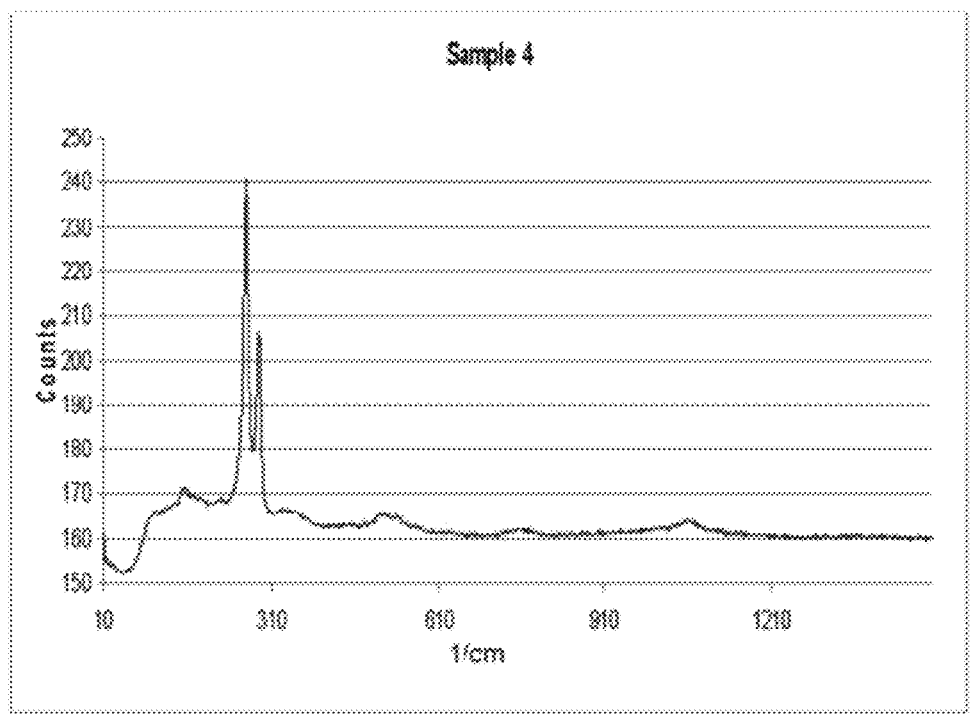
FIGS. 5A-B show Raman spectra of two intrinsic GaAs layers formed according to methods disclosed herein.
Figure 5:
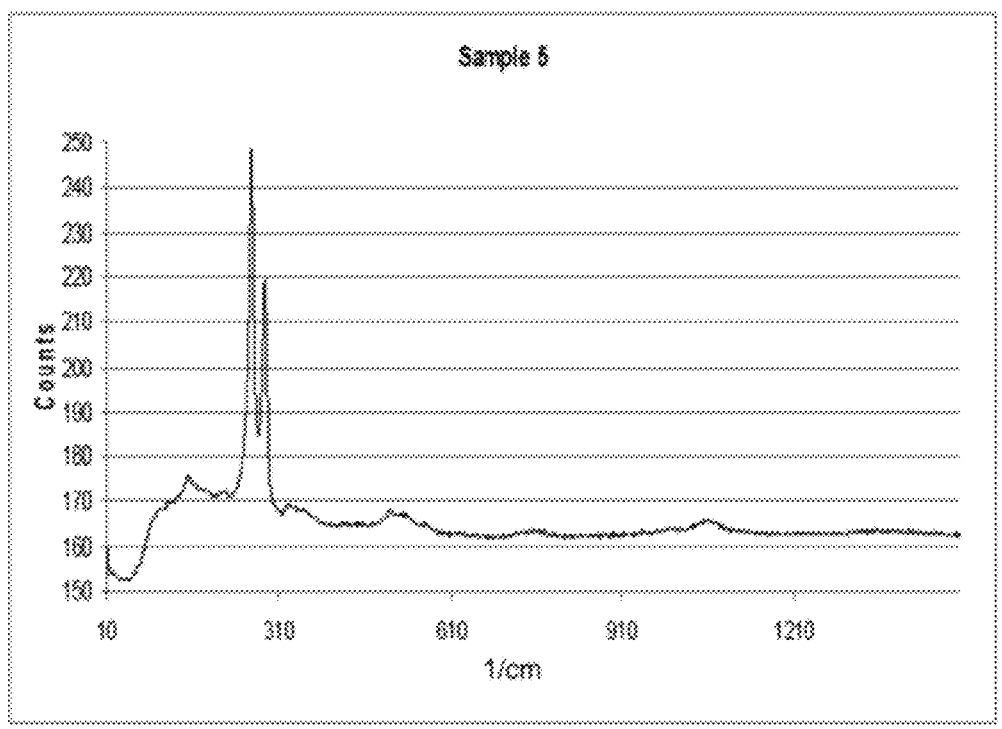

The iGaAs layers were studied using Raman spectroscopy and photoluminescence spectroscopy. Raman spectra of two iGaAs layers formed under the deposition parameters of Set 7 (A) and Set 6 (B) are provided in FIG. 5, showing the transverse and longitudinal vibration modes.

Photoluminescence spectra of three different iGaAs layers (B, C, D) formed under the deposition parameters of Sets 2, 4 and 5, respectively, were obtained. For comparison, spectra of a GaAs reference sample was also obtained. The center (nm), height (counts), area (nm×counts) and FWHM (nm), respectively, of the three curves observed for the GaAs reference sample are as follows: 803, 0.162, 4.72, 27.2 (curve 1); 858, 0.379, 21.1, 52.2 (curve 2); and 870, 0.618, 16.3, 24.7 (curve 3). The corresponding values for the curve observed for layer B are as follows: 806, 0.190, 5.51, 27.16. The corresponding values for the two curves observed for layer C are as follows: 803, 0.981, 24.6, 23.5 (curve 1); and 822, 0.295, 12.9, and 41.1 (curve 2). The corresponding values for the curve observed for layer D are as follows: 806, 0.078, 2.42, 28.8.

The photoconductivity of the iGaAs layers were also studied. Table 4 lists the photoconductivity parameters of four different iGaAs layers (A, B, C, D) formed under the deposition parameters of Sets 3, 4, 5 and 8, respectively. In Table 4, $\sigma_{ph}$ is conductivity in light, $\sigma_d$ is conductivity in dark and $E_a$ is excitation energy.

TABLE 4

Photoconductivity of iGaAs layers

| | | 50 V | | | | 20 V | | | |
|---|---|---|---|---|---|---|---|---|---|
| Sample ID | Thickness (nm) | $\sigma_{ph}$ (S/cm) | $\sigma_d$ (S/cm) | $\sigma_{ph}/\sigma_d$ | $E_a$ (eV) | $\sigma_{ph}$ (S/cm) | $\sigma_d$ (S/cm) | $\sigma_{ph}/\sigma_d$ | $E_a$ (eV) |
| S3-400OC-5H | 1000 | 6.30E−04 | 2.46E−04 | 2.56 | 2.10E−01 | 5.74E−04 | 2.05E−04 | 2.80 | 2.24E−01 |
| S4-500OC-10H | 1000 | 2.26E−05 | 1.59E−05 | 1.42 | 3.29E−01 | 2.16E−05 | 1.48E−05 | 1.45 | 3.16E−01 |
| S5-500OC-10H | 1000 | 7.50E−07 | 5.88E−07 | 1.28 | 2.25E−01 | 7.04E−07 | 6.10E−07 | 1.15 | 2.06E−01 |
| Sample 8 | 1000 | 9.445E−05 | 5.00E−05 | 1.89 | 3.40E−01 | 8.12E−05 | 4.34E−05 | 1.87 | 3.36E−01 |

The Raman, photoluminescence and photoconductivity studies confirm that the iGaAs layers are of high quality, have minimal defects, and exhibit high mobility of photoinduced charge carriers.

Example 2

Formation of a PIN Structure

Figure 6:
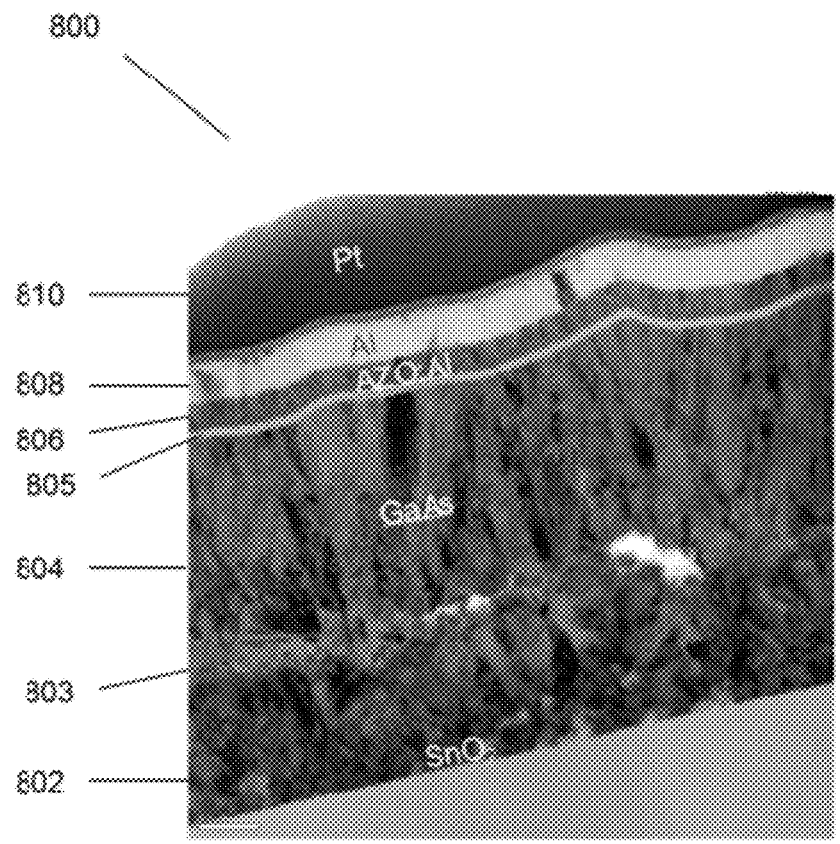
FIG. 6 shows a PIN structure having an intrinsic GaAs layer formed according to the methods disclosed herein.

PIN structures having intrinsic GaAs layers were formed by depositing the appropriate layers on a substrate using the methods disclosed above. One such PIN structure 800 is shown in FIG. 6. The layers in the structure are as follows: tin oxide ($SnO_2$) 802, amorphous p-type silicon 803, intrinsic GaAs (GaAs) 804, amorphous n-type silicon 805, aluminum doped zinc oxide (AZO:Al) 806, aluminum (Al) 808 and platinum (Pt) 810.

Example 3

Formation of Layers of Intrinsic GaAs (i-GaAs) Using Pulsed Laser Assisted-Chemical Vapor Deposition (PLA-CVD)

Layers of intrinsic GaAs were formed on various substrates using PLA-CVD. Substrates were prepared as in Example 1. Target materials were prepared as follows. Stoichiometric amounts of trimethyl gallium and arsenic amide were dissolved in toluene in a glove box under inert atmosphere. The liquid solution was transferred in an air tight container to the apparatus 1000 shown in FIG. 8. Some liquid solution was placed in the target holder 1004 where it froze to form the target material 1002 due to the liquid nitrogen bath 1006. The liquid nitrogen bath was surrounded by thermal insulating material 1008. The apparatus 1000 was placed in a PLD chamber. Substrates were also loaded into the chamber, which was then evacuated and kept under vacuum. The laser was centered on the target material for ablation. Other PLD parameters were varied as in Example 1. The deposited layers were studied using scanning electron microscopy (SEM), energy dispersive x-ray analysis (EDAX) and UV-Visible transmission spectroscopy. For at least one exemplary sample, SEM images revealed that the intrinsic GaAs layer included particles of intrinsic GaAs embedded within the layer. EDAX spectra confirmed that the layer included both Ga and As. X-ray diffraction scans showed that the intrinsic GaAs layer included some amorphous content and some non-oriented polycrystalline content.

The word "illustrative" or "exemplary" is used herein to mean serving as an example, instance, or illustration. Any aspect or design described herein as "illustrative" or "exemplary" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

The foregoing description of illustrative embodiments of the invention have been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A PIN structure comprising:
   (a) a layer of amorphous n-type silicon;
   (b) a layer of intrinsic GaAs disposed over the layer of amorphous n-type silicon; and
   (c) a layer of amorphous p-type silicon disposed over the layer of intrinsic GaAs,
   wherein a surface of the layer of intrinsic GaAs comprises a random distribution of protrusions projecting away from the surface of the layer, further wherein the protrusions are characterized by a circular cross-section, and further wherein the protrusions are characterized by an average diameter of about 50 nm or greater and an average height of about 10 nm or greater.

2. The PIN structure of claim 1, wherein the layer of intrinsic GaAs comprises non-oriented polycrystalline intrinsic GaAs.

3. The PIN structure of claim 1, wherein the layer of intrinsic GaAs comprises oriented polycrystalline intrinsic GaAs.

4. The PIN structure of claim 1, wherein the layer of intrinsic GaAs comprises metallic particles embedded within the layer, the metallic particles comprising one or more noble metals.

5. The PIN structure of claim 4, wherein the noble metals are selected from the group consisting of ruthenium, rhodium, palladium, silver, osmium, iridium, platinum, gold, and combinations thereof.

6. The PIN structure of claim 4, wherein the average size of the metallic particles is greater than the average size of crystal grains within the layer of intrinsic GaAs.

7. The PIN structure of claim 4, wherein the areal density of the metallic particles is about $5 \times 10^4$ $cm^{-2}$ or greater.

8. A PIN structure comprising:
   (a) a layer of amorphous n-type silicon;
   (b) a layer of intrinsic GaAs disposed over the layer of amorphous n-type silicon; and
   (c) a layer of amorphous p-type silicon disposed over the layer of intrinsic GaAs, wherein the layer of intrinsic GaAs comprises metallic particles embedded within the layer, the metallic particles comprising one or more noble metals, and further wherein the metallic particles are characterized by a maximum dimension of about 100 nm or greater.

9. A photovoltaic device comprising:
   (a) a PIN structure comprising:
      (i) a layer of amorphous n-type silicon;
      (ii) a layer of intrinsic GaAs disposed over the layer of amorphous n-type silicon; and
      (iii) a layer of amorphous p-type silicon disposed over the layer of intrinsic GaAs, wherein a surface of the layer of intrinsic GaAs comprises a random distribution of protrusions projecting away from the surface of the layer, further wherein the protrusions are characterized by a circular cross-section, and further wherein the protrusions are characterized by an average diameter of about 50 nm or greater and an average height of about 10 nm or greater;
   (b) a first electrode in electrical contact with the layer of amorphous n-type silicon;
   (c) a second electrode in electrical contact with the layer of amorphous p-type silicon; and (d) a voltage source in electrical contact with the first and second electrodes.

10. The photovoltaic device of claim 9, wherein the layer of intrinsic GaAs comprises non-oriented polycrystalline intrinsic GaAs.

11. The photovoltaic device of claim 9, wherein the layer of intrinsic GaAs comprises oriented polycrystalline intrinsic GaAs.

12. The photovoltaic device of claim 9, wherein the layer of intrinsic GaAs comprises metallic particles embedded within the layer, the metallic particles comprising one or more noble metals.

13. The photovoltaic device of claim 12, wherein the noble metals are selected from the group consisting of ruthenium, rhodium, palladium, silver, osmium, iridium, platinum, gold, and combinations thereof.

14. A photovoltaic device comprising:
 (a) a PIN structure comprising:
  (i) a layer of amorphous n-type silicon;
  (ii) a layer of intrinsic GaAs disposed over the layer of amorphous n-type silicon; and
  (iii) a layer of amorphous p-type silicon disposed over the layer of intrinsic GaAs, wherein the layer of intrinsic GaAs comprises metallic particles embedded within the layer, the metallic particles comprising one or more noble metals, and further wherein the metallic particles are characterized by a maximum dimension of about 100 nm or greater;
 (b) a first electrode in electrical contact with the layer of amorphous n-type silicon;
 (c) a second electrode in electrical contact with the layer of amorphous p-type silicon; and
 (d) a voltage source in electrical contact with the first and second electrodes.

15. The PIN structure of claim 1, wherein the layer of intrinsic GaAs is both in direct contact with the layer of amorphous n-type silicon and with the layer of amorphous p-type silicon.

16. The PIN structure of claim 8, wherein the layer of intrinsic GaAs is both in direct contact with the layer of amorphous n-type silicon and with the layer of amorphous p-type silicon.

17. The photovoltaic device of claim 9, wherein the layer of intrinsic GaAs is both in direct contact with the layer of amorphous n-type silicon and with the layer of amorphous p-type silicon.

18. The photovoltaic device of claim 14, wherein the layer of intrinsic GaAs is both in direct contact with the layer of amorphous n-type silicon and with the layer of amorphous p-type silicon.

* * * * *